United States Patent [19]

Jiles

[11] Patent Number: 5,008,621
[45] Date of Patent: Apr. 16, 1991

[54] MULTIPARAMETER MAGNETIC INSPECTION SYSTEM WITH MAGNETIC FIELD CONTROL AND PLURAL MAGNETIC TRANSDUCERS

[75] Inventor: David C. Jiles, Ames, Iowa

[73] Assignee: Iowa State University Research Foundation, Inc., Ames, Iowa

[21] Appl. No.: 338,966

[22] Filed: Apr. 14, 1989

[51] Int. Cl.$^5$ .................... G01R 33/12; G01N 27/72
[52] U.S. Cl. .................................. 324/227; 324/223; 324/232; 324/243
[58] Field of Search ............... 324/200, 209, 222, 223, 324/226–228, 232, 235, 242, 243, 261, 262

[56] References Cited

U.S. PATENT DOCUMENTS

| Re. 19,600 | 6/1935 | Hermann | 324/227 |
|---|---|---|---|
| 1,925,872 | 9/1933 | Hermann | 324/227 |
| 2,656,714 | 10/1953 | Cartier | 73/67 |
| 2,912,642 | 11/1959 | Dahle | 324/34 |
| 3,184,963 | 5/1965 | Dahle | 73/88.5 |
| 3,365,660 | 1/1968 | Steingroever | 324/223 X |
| 3,427,872 | 2/1969 | Leep et al. | 73/88.5 |
| 3,706,029 | 12/1972 | Wandling et al. | 324/40 |
| 3,925,724 | 12/1975 | Steingroever | 324/34 R |
| 4,048,851 | 9/1977 | Portier | 73/141 A |
| 4,083,002 | 4/1978 | Allport | 324/227 |
| 4,138,783 | 2/1979 | Portier | 29/606 |
| 4,207,520 | 6/1980 | Flora et al. | 324/238 |
| 4,316,146 | 2/1982 | Jilken | 324/209 |
| 4,408,160 | 10/1983 | King et al. | 324/209 |
| 4,449,095 | 5/1984 | Steingroever et al. | 324/223 |

(List continued on next page.)

FOREIGN PATENT DOCUMENTS 447653 4/1975 U.S.S.R.
532067 10/1976 U.S.S.R.
883827 11/1981 U.S.S.R.

OTHER PUBLICATIONS

Bozorth, "Ferromagnetism," Van Nostrand, New York, 1951, pp. 8, 9, 507, 512, 549, 612.
D. C. Jiles, "The Effect of Compressive Plastic Deformation on the Magnetic Properties of AISI 4130 Steels With Various Microstructures," J. Phys, D: Appl. Phys. 21 (1988), pp. 1–9.
D. C. Jiles, "Variation of the Magnetic Properties of AISI 4140 Steels With Plastic Strain," Physicas S. Solidi, pp. 417–429, (1988).
D. C. Jiles and D. L. Atherton, "Theory of Ferromagnetic Hysteresis (invited)", J. Appl. Phys. 55(6), Mar. 15, 1984, pp. 2115–2120.
"Theory of the Magnetization Process in Ferromagnets and its Application to the Magnetomechanical Effect", D. C. Jiles and D. L. Atherton, The Institute of Physics, 1984, pp. 1265–1281.
"Theory of Ferromagnetic Hysteresis", D. C. Jiles and D. L. Atherton, Elsevier Science Publishers B.V., pp. 48–60, (1986).

Primary Examiner—Gerard R. Strecker
Attorney, Agent, or Firm—Leydig, Voit & Mayer

[57] ABSTRACT

A multiparameter magnetic inspection system for providing an efficient and economical way to derive a plurality of independent measurements regarding magnetic properties of the magnetic material under investigation. The plurality of transducers for a plurality of different types of measurements operatively connected to the specimen. The transducers are in turn connected to analytical circuits for converting transducer signals to meaningful measurement signals of the magnetic properties of the specimen. The measurement signals are processed and can be simultaneously communicated to a control component. The measurement signals can also be selectively plotted against one another. The control component operates the functioning of the analytical circuits and operates and controls components to impose magnetic fields of desired characteristics upon the specimen. The system therefore allows contemporaneous or simultaneous derivation of the plurality of different independent magnetic properties of the material which can then be processed to derive characteristics of the material.

21 Claims, 1 Drawing Sheet

U.S. PATENT DOCUMENTS

| | | | |
|---|---|---|---|
| 4,481,470 | 11/1984 | Wallace | 324/228 |
| 4,497,209 | 2/1985 | Kwun et al. | 73/601 |
| 4,523,482 | 6/1985 | Barkhoudarian | 73/862.36 |
| 4,599,563 | 7/1986 | Tiitto et al. | 324/232 |
| 4,623,841 | 11/1986 | Stinson et al. | 324/223 |
| 4,648,041 | 3/1987 | Tarr | 324/227 X |
| 4,689,558 | 8/1987 | Ruuskanen et al. | 324/209 |
| 4,692,701 | 9/1987 | Dundas et al. | 324/240 |
| 4,745,809 | 5/1988 | Collins et al. | 324/226 X |
| 4,746,858 | 5/1988 | Metala et al. | 324/200 |
| 4,788,504 | 11/1988 | Blanpain et al. | 324/261 X |
| 4,792,756 | 12/1988 | Lam et al. | 324/227 X |
| 4,855,677 | 8/1989 | Clark, Jr. et al. | 324/232 X |
| 4,931,730 | 6/1990 | Olsen et al. | 324/227 X |

MULTIPARAMETER MAGNETIC INSPECTION SYSTEM WITH MAGNETIC FIELD CONTROL AND PLURAL MAGNETIC TRANSDUCERS

GRANT REFERENCE

This invention was made with Government support under Contract No. W-7405-ENG82 awarded by the Department of Energy. The Government has certain rights in the invention.

BACKGROUND OF THE INVENTION

1. Field of the Invention

The present invention relates to a means for analyzing and inspecting magnetic materials, and in particular, to a means for rapidly and simultaneously inspecting a magnetic material for a plurality of independent parameters to derive composite and correlated information of the properties and structure of the material.

2. Problems in the Art

A variety of characteristics of magnetic materials can be derived from various inspection measurements and analysis of those measurements. Particularly valuable are inspection methods which allow a specimen to be left intact; that is, by investigating the specimen non-destructively.

Nondestructive evaluation (NDE) of magnetic materials has its obvious advantages, such as are well appreciated in the art. A variety of different analytical NDE procedures have been developed over the years with a variety of objectives and results.

For example, different well known in the art measurements exist regarding magnetic hysteresis, magnetostriction, Barkhausen effect, and magnetoacoustic emission. From each of these measurements, information regarding the magnetic material being analyzed can be derived. For example, from magnetic hysteresis data such parameters as coercivity, remanence, hysteresis loss, initial permeability, maximum differential permeability, and anhysteretic permeability can be derived.

The different measurements and their derivative information regarding a variety of characteristics of the magnetic specimen are known in the art. However, as can be appreciated, each measurement and derivative result involves different apparatus, methods, and computations.

It would be advantageous to be able to have a means and method for coordinating and combining a variety of these various inspection and analysis methods so that their results can be compiled and utilized to produce composite and valuable information regarding characteristics of the specimen under analysis.

It is therefore a primary and principle object of the present invention to produce a multiparameter magnetic inspection system which solves or improves over the problems and deficiencies in the art.

Another object of the present invention is to provide a system as above described which allows for contemporaneous or simultaneous, and rapid, derivation and compilation of results for a plurality of independent parameters regarding the specimen.

A still further object of the present invention is to provide a system as above described which can control and compute the variety of measurements and information to produce meaningful results regarding the specimen being analyzed.

A still further object of the present invention is to provide a system as above described which eliminates the requirement for individual measurements and procedures, which are unrelated and uncorrelated.

Another object of the present invention is to provide a system as above described which is efficient, economical, and flexible in its uses and applications.

These and other objects, features, and advantages of the present invention will become more apparent with reference to the accompanying specification and claims.

SUMMARY OF THE INVENTION

The present invention is a multiparameter magnetic inspection system for measuring a plurality of magnetic properties for magnetic materials and then utilizing those measurements to derive meaningful compiled and correlated information regarding characteristics of the specimen.

The specimen is positionable in a mount or housing to which a means for applying magnetic fields of various properties and characteristics is associated. A plurality of measurement transducers can then be conveniently associated with the specimen, and have communication cables to corresponding analytical circuitry for each transducer.

A control means coordinates operation of the system. It is programmable to instruct changes in the magnetic field produced surrounding the specimen, and to operate the analytical circuitry means which receive transducer signals.

The control means operates the analytical circuitry means according to preselected formats, so that the analytical circuitry means receive the transducer signals, convert transducer signals into analog measurement signals, and communicate those measurement signals to the control means.

Each of the transducer means measures an independent magnetic measurement parameter of the specimen through any changes in the magnetic field instructed by the control means. Additionally, the control means converts the analog measurement signals to a form that can be processed, each separately, or in any combination.

The control means therefore allows contemporaneous or even simultaneous compilation of measurements from the analytical procedure, all of which can be used to derive a compiled, composite, and/or correlated profile of the characteristics of the specimen.

The control means can also operate peripheral equipment, for example, record producing means and memory storage means.

DETAILED DESCRIPTION OF THE PREFERRED EMBODIMENT

Figure 1:
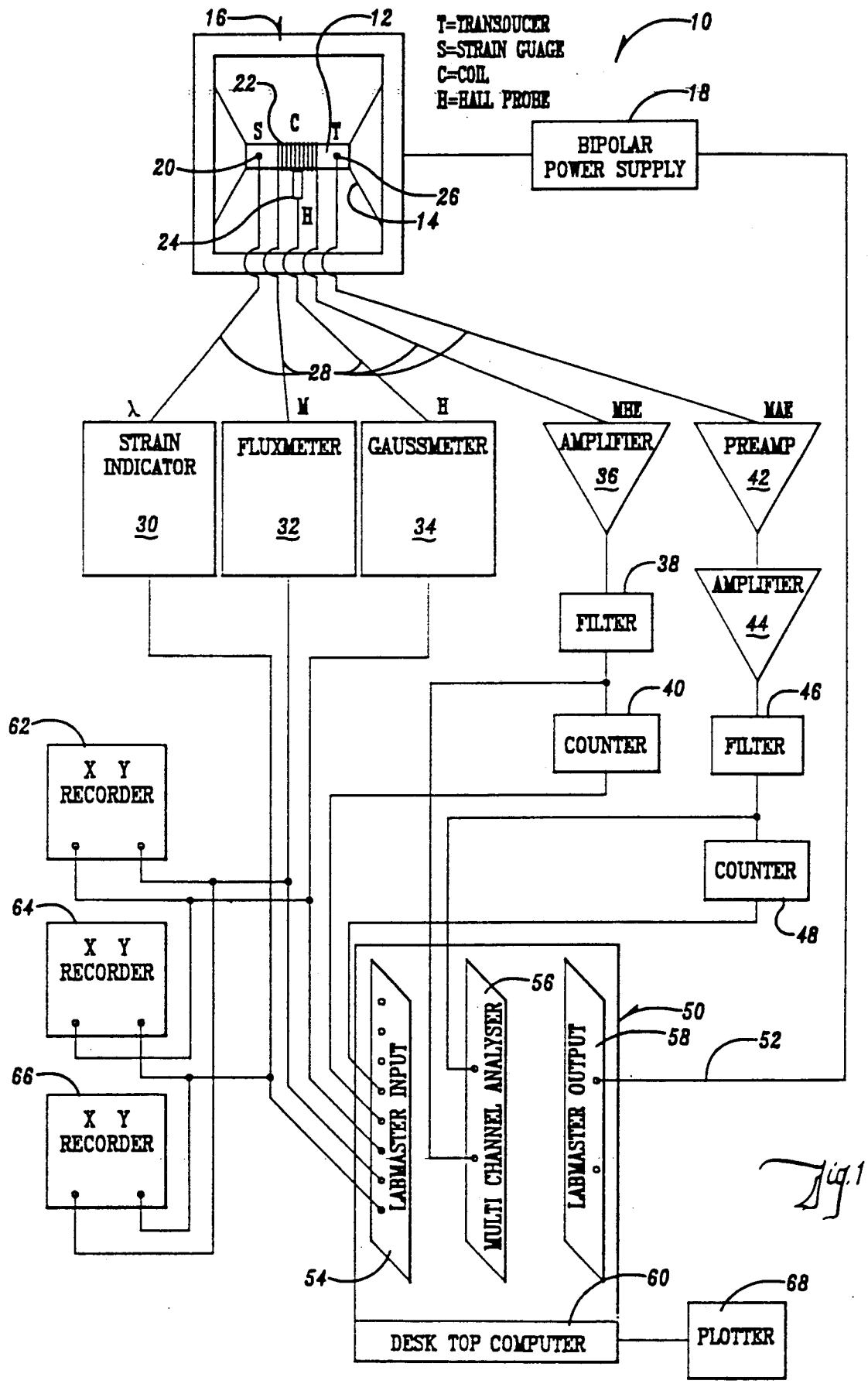
FIG. 1 is a schematic view of a preferred embodiment of the invention.

With reference to FIG. 1, a detailed description of the preferred embodiment of the invention will be presented. It is to be understood that this detailed description is to aid in understanding the invention. It is not intended to limit the application, which is defined solely by the claims which follow this description.

With particular reference to FIG. 1, a multiparameter magnetic inspection system 10, according to the present invention, is schematically illustrated. A specimen 12, generally a soft magnetic material (for example, some varieties of steel), is positioned within a mount or housing 14. A magnetic field device 16 surrounds specimen 12, and is powered by bipolar power supply 18, such as is known in the art, to present magnetic fields of various properties and characteristics to specimen 12.

System 10 also facilitates the coordinated and combined association of a plurality of transducers and measuring devices on, at, or near specimen 12. In the preferred embodiment, a strain gauge 20, coil 22, Hall probe 24, and magnetoacoustic transducer 26 are all operatively associated with specimen 12 in its mounted position. Electrical cables 28 are connected through or around the mount or housing 14 to various analytical circuitry uniquely associated with each measuring device.

As shown in FIG. 1, strain gauge 20 is communicated to strain indicator 30. Coil 22 is associated with fluxmeter 32. Hall probe 24 is connected to gaussmeter 34.

Coil 22 is also connected to an analytical circuitry comprised of an amplifier 36 in series with a filter 38 which is in turn in series, with a counter device 40.

Magnetoacoustic transducer 26 is connected to the series of components shown to be preamp 42, amplifier 44, filter 46, and counter 48.

A control means 50 receives the outputs from all of the analytical circuitries and instruments. It additionally has an output line 52 which is connected to bipolar power supply 18.

In the preferred embodiment of FIG. 1, control means consists of an input board 54, a multichannel analyzer board 56, an output board 58, and a computer processor 60. The input board 54 is to be understood to comprise not only input ports for the various analytical circuits, but also a digital to analog converter. The transducers and measuring components, and the analytical circuits are all analog, therefore requiring the conversion to digital so that these signals can be processed by control means 50. Similarly, output board 58 may contain a digital to analog converter s that control means 50 can instruct power supply 18 in its operation, which in turn, can alter the magnetic field around specimen 12.

The preferred embodiment also includes X-Y recorders 62, 64, and 66 which can create simultaneous and contemporaneous hard-copy records of selected information coming from analytical circuits 30, 32, and 34. It is to be noted, of course, that the recorders can be connected in such a manner to plot information from the various analytical circuits against one another, as desired.

Furthermore, computer processor 60 can itself have a plotter 68 available to plot hard copy records of selected information, or correlated information, or comparisons or plots of various information.

It is further to be understood that computer/processor 60 contains memory means, such as fixed disk or floppy disks memories, or can be connected to a mainframe computer, such as is well known in the art and such as is desired.

It can therefore be seen that the present invention provides a means and method for contemporaneous, if not simultaneous, efficient, and rapid retention of the variety of measurements and derivative information from those measurements to in turn derive highly beneficial correlated information regarding the characteristics of the material.

In the preferred embodiment of FIG. 1, computer/processor 60 could be an IBM PC desk top computer. Any compatible plotter 68 could be utilized. Input and output boards 54 and 58 are available from Tecmar, Inc., 6225 Cochran Road, Solon, Cleveland, Oh. 44139 under the product designation "Lab Master". In those particular embodiments, a 12-bit analog to digital or digital to analog converter is utilized. This particular product is sensitive enough to utilize the output from the analytical circuits, including strain indicator 30, fluxmeter 32, and gaussmeter 34, to convert the information reliably into digital data.

Gaussmeter 34 and fluxmeter 32 can.be obtained from Walker Scientific Incorporated, under model numbers MG-3A, and MF-3A, respectively. Strain indicator 30 can be a Micromeasurements model 3800 wide-range strain indicator.

In operation, measurement of induction (B) and field strength (H) of the specimen are obtained along with strain ($\lambda$), all as are known in the art. Barkhausen count rate (dn/dt) is also derived.

These measurements are then converted and communicated to computer/processor 60. They are then combined and correlated to calculate magnetization (B-H)/$4\pi$, permeability $\mu = B/H$, differential permeability $\mu' = dB/dH$, magnetostriction, and Barkhausen emissions for each counterpoint.

It is further to be understood that coercivity $H_c$ and remanance $B_r$ are calculated by interpolation of results by analyzing the hysteresis loop close to B=0 and H=0 by obtaining intercepts on the H and B axes.

The value of the hysteresis loss ($W_H$) is calculated by integration around the hysteresis loop. Initial and anhysteretic permeabilities $\mu'_{in}$ and $\mu!_{an}$ are obtained using linear least-squares analysis of data at the origin H=0, B=0. Maximum differential permeability $\mu'_{max}$ is calculated from the slope of the hysteresis loop at $H_c$, B=0.

The system allows magnetic Barkhausen effect emissions to be detected from coil 22 wound onto the specimen. The signal is amplified using preamplifier (Princeton Applied Research, model 113A), a filter (Krohn-Hite, model 3202), and a pulse counter (Hewlett Packard, model HP5304A). The count rate of Barkhausen pulses above a preset threshold level is measured. Integration of the signal allows the total number of emissions to be found.

Magnetoacoustic emission is detected and derived similarly. The magnetoacoustic emission measurements can be fully integrated utilizing the multichannel analyzer (The Nuclei, Inc., model PCA-1000) which is directly installable into an IBM PC.

The value of the system is further shown in utilizing X-Y plotters 64, 66, and 68, to give hard copy records of plots of various measurements, and then the use of computer/processor 60 to further operate on the measurements to produce derived information which is helpful at analyzing the structure of the specimen. Plotter 68 can be a digital plotter (Hewlett Packard HP7470A) which can provide hard copy plots of various derived functions which are not recorded on the X-Y recorders. The plots may be made of magnetization, magnetic induction, permeability, differential permeability, susceptibility or differential susceptibility against magnetic field using either hysteresis loop, initial magnetization curve, or anhysteretic magnetization data.

By utilizing the system 10 of the preferred embodiment, all of the various independent non-related or correlated parameters can be related or correlated. For a specimen such as steel, valuable information related to the microstructure of the specimen can be derived from the single inspection and analysis procedure.

It will be appreciated that the present invention can take many forms and embodiments. The true essence and spirit of this invention are defined in the appended claims, and it is not intended that the embodiment of the invention presented herein should limit the scope thereof.

What is claimed is:

1. A multiparameter magnetic inspection system for deriving and displaying a plurality of related magnetic parameters of specimens, some of the parameters being measured in that they are obtained from tranducer signals and others being derived from one or more of the measured parameters, the system comprising in combination:

housing means for holding a specimen to be inspected;

magnetic field means connectable to the housing means for applying magnetic fields of various properties and characteristics to the specimen;

a plurality of inspection transducers of different types mountable on or adjacent to the specimen in the housing means for inspecting the specimens and producing transducer signals related to and representing measures of different magnetic specimen parameters as a result of magnetic fields applied thereto;

measuring circuitry means for each inspection transducer to receive and convert the transducer signals into a plurality of measurement signals; the measurement signals being independent in that they result from transducer signals which are produced by the plurality of different inspection transducers but related in that they are produced from the same specimen subjected to the same magnetic fields;

communication cable means for connecting the inspection transducers with the analytical circuit means; and control means for instructing application of and changes in magnetic fields to the specimen; receiving the measurement signals resulting from the application of and changes in the magnetic field; and contemporaneously and rapidly from said measurement signals compiling the measured parameters, deriving the derived parameters from the measured parameters, and displaying the related measured and derived parameters for the inspected specimen.

2. The system of claim 1 wherein the specimen is a magnetic material.

3. The system of claim 1 wherein the specimen is a soft magnetic material.

4. The system of claim 1 wherein the transducers are selected from the set including but not limited to a strain gauge means, a coil means, a Hall probe means, and a magnetoacoustic transducer.

5. The system of claim 1 wherein the measuring circuitry means include a plurality of instrumentation circuits for producing the measurement signals.

6. The system of claim 5 wherein the measuring circuitry means are selected from the set including but not limited to a strain indicator means, a fluxmeter means, a gaussmeter means, a magnetic Barkhausen effect emissions circuit, and a magnetoacoustic emission circuit.

7. The system of claim 6 wherein the magnetic Barkhausen effect emission circuit includes in series an amplifier which receives the transducer signal from one of the inspection transducers a filter means, and a counter means.

8. The system of claim 6 wherein the magnetoacoustic emission circuit includes a preamplifier means receiving the transducer signal from one of the inspection transducers, an amplifier means, a filter means, and a counter means.

9. The system of claim 1 further comprising an analog to digital converter means for converting analog measurement signals into digital data signals for use by the control means.

10. The system of claim 1 further comprising digital to analog converter means for converting signals of the control means into signals for operating the field means.

11. The system of claim 1 further comprising one or more plotting means for selectively graphing desired measurement signals.

12. The system of claim 1 further comprising plotting means connected to the control means, for selectively plotting parameters of the specimen.

13. The system of claim 1 wherein the system is utilized to derive magnetic parameters from the set including but not limited to magnetic hysteresis, magnetostriction, Barkhausen effect, and magnetoacoustic emission.

14. The system of claim 1 wherein the field means is controlled to perform functions selected from the set including but not limited to demagnetization, field sweeping, and hysteretic magnetization.

15. The system of claim 13 wherein the control means can convert magnetic hysteresis data into magnetic parameters selected from the set including but not limited to coercivity $H_c$, remanent induction $B_4$, hysteresis loss $W_H$, initial permeablilty $\mu'_{an}$, maximum differential permeabilty $\mu'_{max}$.

16. The system of claim 1 wherein the control means can derive characteristics of the specimen such as microstructure of the specimen.

17. The system of claim 1 wherein the control means includes programmable means.

18. The system of claim 17 wherein the programmable means and the control means controls operation of the field means including, but not limited to the set comprising demagnetization, initial magnetiziation, and hysteretic magnetization, hysteresis loop algorithms.

19. The system of claim 17 wherein the programmable means and control means operate the instruments including but not limited to the set comprising zeroing of meters, enabling or disabling plotting means, controlling hard copy record production.

20. A method for a multiparameter magnetic inspection system for deriving and displaying a plurality of related magnetic parameters of specimens, some of the parameters being measured in that they are obtained from transducer signals and others being derived from one or more of the measured parameters, the method comprising the steps of:

operatively associating a plurality of transducers of different types with respect to a specimen for inspecting the specimen;

operatively associating a means for applying magnetic fields of various properties and characteristics to the specimen to produce resulting transducer signals in the transducers, the transducer signals being related to and representing measures of different magnetic specimen parameters;

operatively connecting measuring circuitry means to each transducer for converting the transducer signals to a plurality of measurement signals; the measurement signals being independent in that they result from transducer signals which are produced by the plurality of different inspection transducer, but related in that they are produced from the same specimen subjected to the same magnetic fields;

contemporaneously controlling the field and producing a plurality of measurement signals at different field conditions;

contemporaneously and rapidly from said measurement signals compiling the measured parameters, deriving the derived parameters from the measured parameters, and displaying the related measured and derived parameters for the inspected specimen.

21. The method of claim 20 wherein contemporaneous converting, utilizing, and compiling of the measurement signals is virtually instantaneous.

* * * * *